(12) United States Patent
Barsoukov et al.

(10) Patent No.: US 7,856,328 B2
(45) Date of Patent: Dec. 21, 2010

(54) SYSTEMS, METHODS AND CIRCUITS FOR DETERMINING POTENTIAL BATTERY FAILURE BASED ON A RATE OF CHANGE OF INTERNAL IMPEDANCE

(75) Inventors: Yevgen P. Barsoukov, Richardson, TX (US); Garry Elder, Rockwall, TX (US); Jinrong Qian, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 483 days.

(21) Appl. No.: 11/869,789

(22) Filed: Oct. 10, 2007

(65) Prior Publication Data

US 2009/0099802 A1 Apr. 16, 2009

(51) Int. Cl.
*G06F 19/00* (2006.01)
(52) U.S. Cl. ...................................................... 702/63
(58) Field of Classification Search .................. 702/63, 702/64, 182–185, 188
See application file for complete search history.

(56) References Cited

U.S. PATENT DOCUMENTS 6,789,026 B2  9/2004  Barsoukov et al.
6,832,171 B2  12/2004  Barsoukov et al.
2005/0017687 A1  1/2005  Nagaoka
2007/0052424 A1*  3/2007  Okumura .................... 324/432

FOREIGN PATENT DOCUMENTS

JP  2007-046942  2/2007
JP  2007-071632  3/2007
WO  2006-022073  3/2006

OTHER PUBLICATIONS

U.S. Appl. No. 11/869,793, filed Oct. 10, 2007, Barsoukov et al.

* cited by examiner

*Primary Examiner*—Edward Raymond
(74) *Attorney, Agent, or Firm*—William B. Kempler; Wade J. Brady, III; Frederick J. Telecky, Jr.

(57) ABSTRACT

Various systems and methods for determining potential battery failure are disclosed. For example, some embodiments of the present invention provide battery systems that include a battery, an embedded processor and a computer readable medium. The computer readable medium includes instructions executable by the embedded processor to measure at least one characteristic of the battery; to calculate a rate of change of internal impedance of the battery based at least in part on the at least one characteristic of the battery; and to determine a potential failure condition based on the rate of change of internal impedance of the battery.

21 Claims, 4 Drawing Sheets

SYSTEMS, METHODS AND CIRCUITS FOR DETERMINING POTENTIAL BATTERY FAILURE BASED ON A RATE OF CHANGE OF INTERNAL IMPEDANCE

BACKGROUND OF THE INVENTION

The present invention is related to battery monitoring, and more particularly to systems and methods for detecting potential battery failure.

A number of electronic devices utilize rechargeable batteries and associated charging systems. A rechargeable battery may be repeatedly charged and discharged over the course of its useful life. The process of charging and discharging is generally performed without incident other than the typical operational degradation of the battery over the course of operation. Indeed, most battery failure mechanisms operate to gradually decrease useful battery life and do not cause a safety hazard.

At times one or more mechanisms may come into play that result in the catastrophic battery failure. Catastrophic battery failure may be benign resulting in, for example, an irreversible and immediate failure of the battery. Other times, however, a catastrophic battery failure may result in a fire with all of the problems associated therewith. As just some examples, degradation of the battery cells may include detachment, displacement or disintegration of one or more internal components that can cause an electrical short followed by a possible fire or explosion of the battery cell. Such an outcome may result in considerable property damage and personal injury.

Some electronic devices employ an external protection circuit to detect overheating of the battery. When overheating is detected, the battery may be disconnected from a circuit to which it is connected. Such an approach offers some ability to limit damage to an external circuit due to aberrant battery behavior, however, at times the overheating is a sign of an irreversible process that ultimately results in a fire or explosion. Thus, while the aforementioned external circuits offer some level of protection, the possibility of fire or explosion still remains.

Thus, for at least the aforementioned reasons, there exists a need in the art for advanced systems, circuits and methods for determining potential battery failure.

BRIEF SUMMARY OF THE INVENTION

The present invention is related to battery monitoring, and more particularly to systems and methods for detecting potential battery failure.

Various embodiments of the present invention provide battery systems that include a battery, an embedded processor and a computer readable medium. As used herein, the phrase "computer readable medium" is used in its broadest sense to mean any medium that may contain information accessible to a computer or processor. Thus, a computer readable medium may be, but is not limited to, a random access memory, a non-volatile memory, a magnetic storage medium, an optical storage medium or the like. Based on the disclosure provided herein, one of ordinary skill in the art will recognize a variety of computer readable media that may be utilized in accordance with different embodiments of the present invention. The computer readable medium includes instructions executable by the embedded processor to measure at least one characteristic of the battery; to calculate a rate of change of internal impedance of the battery based at least in part on the at least one characteristic of the battery; and to determine a potential failure condition based on the rate of change of internal impedance of the battery. In some of the aforementioned embodiments, the measured characteristic of the battery may include one or more of voltage, current and temperature.

In various instances of the aforementioned embodiments, determining the potential failure condition based on the rate of change of internal impedance of the battery includes comparing the rate of change of internal impedance of the battery against a threshold value, and indicating a potential failure of the battery whenever the rate of change of internal impedance of the battery exceeds the threshold. In such instances, the threshold may be programmable, and the rate of change of internal impedance may either be an immediate rate of change or an average rate of change. As used herein, the phrase "immediate rate of change" is a rate of change calculated based on the change between two data points. In contrast, as used herein, the phrase "average rate of change" is a rate of change calculated based on three or more data points.

In various instances of the aforementioned embodiments, the battery includes at least a first battery cell and a second battery cell. In such instances, measuring the at least one characteristic of the battery includes measuring at least one characteristic of the first battery cell and measuring at least the same characteristic of the second battery cell. Further, calculating the rate of change of internal impedance of the battery includes calculating a first rate of change of internal impedance of the first battery cell based on the measured characteristic of the first battery cell and calculating a second rate of change of internal impedance of the second battery cell based on the measured characteristic of the first battery cell. Determining the potential failure condition based on the rate of change of internal impedance of the battery includes: comparing the difference between the first rate of change of internal impedance and the second rate of change of internal impedance against a threshold value; and indicating a potential failure of the battery whenever an absolute value of the difference between the first rate of change of internal impedance and the second rate of change of internal impedance exceeds the threshold. In such instances, the threshold may be programmable, and both the first rate of change of internal impedance and the second rate of change of internal impedance may either be an immediate rate of change or an average rate of change.

Other embodiments of the present invention provide methods for predicting battery failure. Such methods include providing a battery, and measuring at least one characteristic of the battery, such as, for example, voltage, current and/or temperature. The methods further include calculating a rate of change of internal impedance of the battery based at least in part on the at least one characteristic of the battery, and determining a potential failure condition based on the rate of change of internal impedance of the battery.

In some instances of the aforementioned embodiments, determining the potential failure condition based on the rate of change of internal impedance of the battery includes: comparing the rate of change of internal impedance of the battery against a threshold value; and indicating a potential failure of the battery whenever the rate of change of internal impedance of the battery exceeds the threshold. In such instances, the rate of change of internal impedance of the battery may be either an immediate rate of change or an average rate of change.

In other instances of the aforementioned embodiments, the battery includes a first battery cell and a second battery cell. In such instances, measuring the at least one characteristic of the battery includes measuring at least one characteristic of the first battery cell and measuring at least the same characteristic of the second battery cell, and calculating the rate of change of internal impedance of the battery includes calculating a first rate of change of internal impedance of the first battery cell based on the measured characteristic of the first battery cell and calculating a second rate of change of internal impedance of the second battery cell based on the measured characteristic of the first battery cell. Determining the potential failure condition based on the rate of change of internal impedance of the battery includes comparing the difference between the first rate of change of internal impedance and the second rate of change of internal impedance against a threshold value; and indicating a potential failure of the battery whenever an absolute value of the difference between the first rate of change of internal impedance and the second rate of change of internal impedance exceeds the threshold.

Yet other embodiments of the present invention provide electronic systems that include a battery powered electronic circuit, and a battery system. The battery powered electronic circuit includes a device processor and may be, but is not limited to, a circuit of a cellular telephone, a laptop computer, a game device, an audio player, or a video player. The battery system powers the electronic circuitry, and includes: a battery, an embedded processor, and a computer readable medium. The computer readable medium includes instructions executable by the embedded processor to: measure at least one characteristic of the battery, calculate a rate of change of internal impedance of the battery based at least in part on the at least one characteristic of the battery, and determine a potential failure condition based on the rate of change of internal impedance of the battery. In some instances, the computer readable medium includes instructions executable by the embedded processor to send the potential failure indication to the device processor. Further, the device processor may be operable to disconnect the battery from the battery powered electronic circuit; and to provide a user message indicating the potential failure indication.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to battery monitoring, and more particularly to systems and methods for detecting potential battery failure.

Figure 1A:
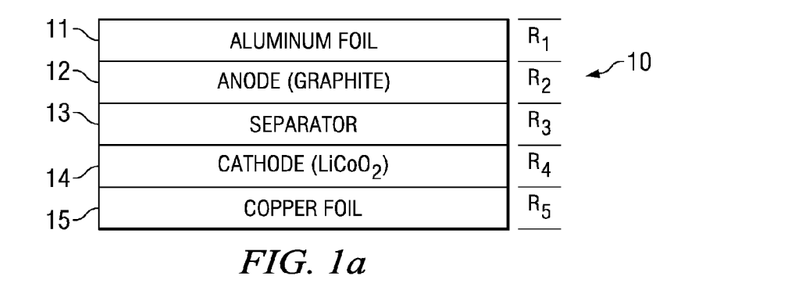
FIGS. 1a-1c depict an exemplary battery cell structure and two exemplary structural defects causing a change in internal impedance, and possibly resulting in a potential catastrophic failure that may be detected using one or more embodiments of the present invention.

Turning to FIG. 1a, an exemplary battery cell 10 is depicted and includes an aluminum current collector 11, a graphite anode 12, a separator 13, a lithium based cathode 14, and a copper current collector 15. Each of the aforementioned layers has an associated impedance $R_1$, $R_2$, $R_3$, $R_4$, $R_5$, respectively. Thus, the total internal impedance of battery cell 10 is described by the following equation:

$$\text{Impedance} = R_1 + R_2 + R_3 + R_4 + R_5.$$

Figure 1B:
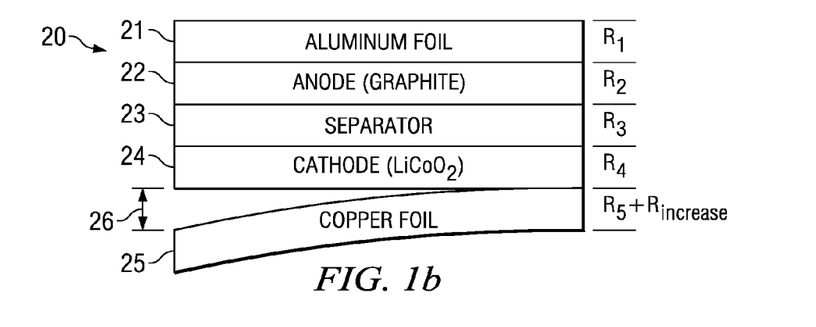
Figure 1C:
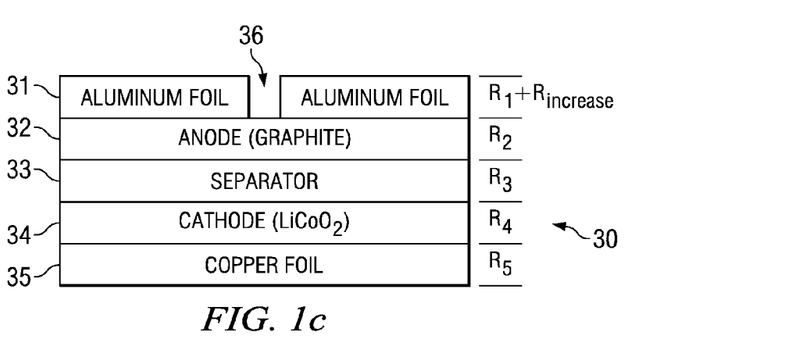

It has been determined that detachment or displacement of a significant structural element of a battery cell (e.g., metallic foil current collector 11 or 15, separator 13, or particle of active material) can cause a measurable change in cell impedance. FIG. 1b depicts an example of one such structural anomaly that leads to an increase in cell impedance. In particular, a battery cell 20 is depicted including an aluminum current collector 21, a graphite anode 22, a separator 23, a lithium based cathode 24, and a copper current collector 25. Each of the aforementioned layers has an associated impedance $R_1$, $R_2$, $R_3$, $R_4$, $R_5$, respectively. However, due to a separation 26 of copper current collector 25, the impedance of the layer including copper current collector 25 is increased to $R_5 + R_{increase}$, where $R_{increase}$ represents the increase in impedance due to separation 26. FIG. 1c depicts an example of one such structural anomaly that leads to an increase in cell impedance. In particular, a battery cell 30 is depicted including an aluminum current collector 31, a graphite anode 32, a separator 33, a lithium based cathode 34, and a copper current collector 35. Each of the aforementioned layers has an associated impedance $R_1$, $R_2$, $R_3$, $R_4$, $R_5$, respectively. However, due to a break 36 in aluminum current collector 31, the impedance of the layer including aluminum current collector 31 is increased to $R_1 + R_{increase}$, where $R_{increase}$ represents the increase in impedance due to break 36. Based on the disclosure provided herein, one of ordinary skill in the art will recognize a variety of structural degradations that may lead to a measurable change in internal impedance.

By continuously measuring the internal impedance of the cell (or multiple cells where that is the case), a change indicating a potential structural event may be detected before a catastrophic event occurs. Specifically, in a single cell battery, a predefined resistance change threshold can be set so that where the threshold is exceeded during predefined period of time or predefined number of cycles, the battery is failed or otherwise identified as potentially problematic. When the battery is failed, it may be disconnected from any external circuitry prior to the occurrence of a safety concern and discharged. In some cases, the battery may include a number of battery cells. In such cases, the resistance characteristics of one cell may be compared against that of other cells to determine if one of the cells exhibits an aberrant impedance characteristic. This may be used to check for false positives due to measurement errors.

In some embodiments of the present invention, impedance measurements used to indicate structural degradation may be performed at one or several frequencies, where either both real and imaginary part or either real or imaginary part or any derived quantities such as phase or modulus is used. Alternatively impedance can be measured from a response to DC current for predefined duration. It can be monitored at one or several states of charge (SOC) as impedance strongly depends on SOC. Impedance can also be compensated for temperature using predefined temperature dependence table stored in device memory. After failure detection, in case of smart battery, corresponding bits can be set to indicate permanent failure due to micro-short. Conditions where event happened can be saved into data-flash memory if available for further analysis by quality control Various embodiments of the present invention rely on monitoring and analysis the rate of change of one or more characteristics of a battery or battery cell. By relying on analysis of the rate of change of a characteristic, more subtle structural changes may be detectable such as, for example, a gradually growing crack in a current collector or in a separator. Detection of more subtle changes in some cases offers sufficient warning of a catastrophic failure so as to allow the battery to be disconnected and safely discharged. In contrast, comparing direct parameters against a threshold as an indication of potential failure may possibly detect an error only a short time before a short circuit or some other catastrophic failure occurs, and thus may not provide sufficient warning to avert a disaster. Other embodiments of the present invention measure changes in internal impedance between cells of a multi-cell battery to achieve an indication of a potential catastrophic battery failure.

Figure 2:
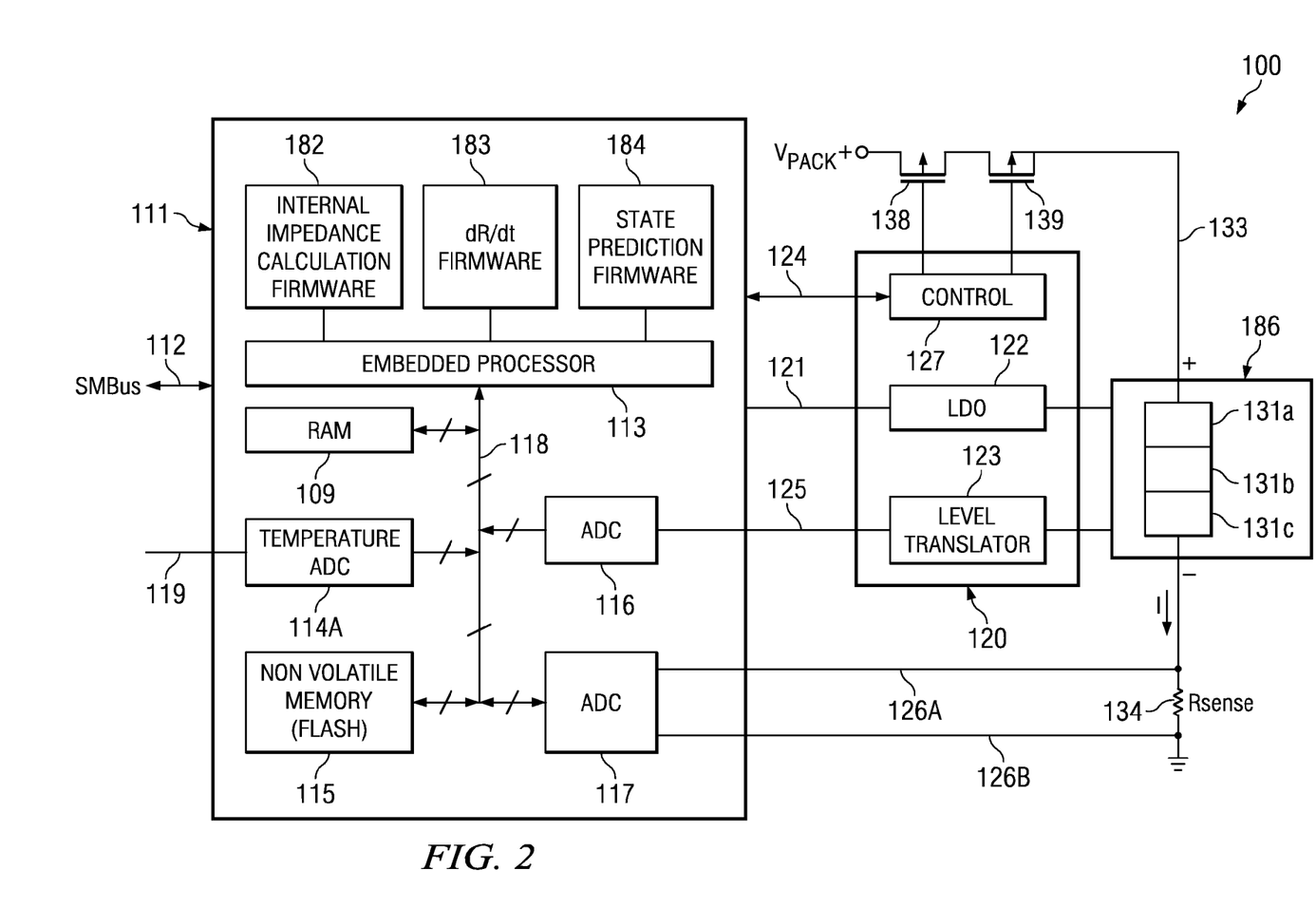
FIG. 2 depicts a block diagram of a battery system in accordance with one or more embodiments of the present invention.

Turning to FIG. 2, a battery system 100 is depicted in accordance with one or more embodiments of the present invention. Battery system 100 includes a multi-cell battery 186, an Impedance and Predictive Calculation circuit 111, and a control circuit 120. In some embodiments of the present invention, all of multi-cell battery 186, Impedance and Predictive Calculation circuit 111, and control circuit 120 are integrated together into a single package and generically referred to herein as a battery pack. As shown, multi-cell battery 186 includes a number of individual battery cells 131 that may be either connected in parallel or series depending upon the particular design of multi-cell battery 186. In a typical implementation, each of cells 131 is substantially equivalent when originally manufactured, but may differ to some degree due to, for example, manufacturing variances and operational variances introduced over the lifetime of the cell. In one particular implementation of the present invention, battery cells 131 are Lithium-ion battery cells.

Impedance and Predictive Calculation circuit 111 includes an embedded processor 113 coupled by a bidirectional data bus 118 to a temperature sensor circuit 114, a nonvolatile memory 115, a random access memory (RAM) 109, an analog-to-digital converter (ADC) 116, and an integrating analog-to-digital converter (ADC) 117. Temperature sensor circuit 114 is coupled to an external sensor 119 which is directly attached to multi-cell battery 186. Temperature sensor circuit 114 is operable to detect a temperature of multi-cell battery 186. Based on the disclosure provided herein, one of ordinary skill in the art will recognize a variety of temperature sensor circuits and/or temperature sensors that may be employed in relation to different embodiments of the present invention. Nonvolatile memory 115 may be, but is not limited to, a conventional flash memory. ADC 116 and ADC 117 may be, for example, conventional analog to digital converters as are known in the art. Based on the disclosure provided herein, one of ordinary skill in the art will recognize a variety of analog to digital controllers that may be used in relation to different embodiments of the present invention. Embedded processor 113 may be, but is not limited to, a commercially available 8 MHz processor having an 8-bit central processing unit (CPU) and a RISC architecture. Various suitable embedded processors that are commercially available can be utilized. For example, the Assignee's MSP430 microprocessor is capable of performing the necessary computations, or an embedded processor such as the one used in the Assignee's BQ8012 fuel gauge chip can be used.

Impedance and Predictive Calculation circuit 111 may be coupled to a standard SMBus (smart bus) 112. Through SMBus 112, Impedance and Predictive Calculation circuit 111 may communicate with another processor (not shown) in accordance with a suitable communications protocol. A conventional interface circuit (not shown) may be coupled between SMBus 112 and data bus 118. Impedance and Predictive Calculation circuit 111 is powered by a supply voltage via a conductor 121, which is connected to the output of a low dropout (LDO) voltage regulator circuit 122 which is included in control circuit 120. A bidirectional data bus 124 is coupled between conventional digital interface circuitry (not shown) in accordance with a standard I2IC in control circuit 120 and control circuitry 127 in control circuit 120. Control circuit 120 also includes a level translator circuit 123 that is coupled by suitable circuitry (not shown) to measure the voltage across one (or more) of the individual battery cells 131 included in multi-cell battery 186 which is used to provide power to a utilization device (not shown) coupled between the "battery pack" terminals V+ and ground. Level translator circuit 123 produces an output that is connected by conductor 125 to the analog input of ADC 116 in Impedance and Predictive Calculation circuit 111. ADC 116 converts the cell voltage to a digital equivalent that can be accessed via data bus 118 by embedded processor 113.

The total voltage across multi-cell battery 186 (e.g., the voltage across one cells 131 multiplied by the number of cells 131 when the cells are connected in series, or the total voltage of each of individual cells 131 when the cells are connected in parallel) is applied to an input of voltage regulator 122. A sense resistor 134 is coupled between ground and the negative terminal of multi-cell battery 186. In one particular embodiment of the present invention, sense resistor 134 is a one hundred milli-Ohm resistor. The voltage across sense resistor 134 is applied as an input to integrating ADC 117, which converts the voltage across sense resistor 134 to a digital representation of the battery current (I) flowing through sense resistor 134. The positive terminal of multi-cell battery 186 is connected by a conductor 133 to the source of a power transistor 139, the gate of which is connected to control circuit 127. The drain of power transistor 139 is connected to the drain of a power transistor 138, the source of power transistor 139 is connected to positive terminal of multi-cell battery 186, and the gate of power transistor 139 is connected to control circuitry 127. The gates of power transistors 138 and 139 are controlled in response to signals received by control circuit 120 from embedded processor 113 via data bus 124. Power transistor 139 operates as a discharge transistor and power transistor 38 operates as a charging transistor. Control circuit 120 includes the conventional interface and control circuitry 127 coupled to bidirectional data bus 124 in accordance with the standard 121C protocol in order to control power transistors 138 and 139.

Various information may be sent from Impedance and Predictive Calculation circuit 111 via data bus 124 to control circuit 120 in order to set various levels and to transmit various safety/control information to control circuit 120. For example, a signal may be sent from Impedance and Predictive Calculation circuit 111 to control circuit 120 that causes power transistor 138 and power transistor 139 to turn on and off at desired times.

Embedded processor 113 is operable to execute firmware instructions that when executed cause Impedance and Predictive Calculation circuit 111 to calculate the impedance (R) of multi-cell battery 186 and/or of individual battery cells 131. In addition, Impedance and Predictive Calculation circuit 111 executes firmware instructions that calculate the rate of change of impedance (dR/dT) of multi-cell battery 186 and/or of individual battery cells 131. Further, Impedance and Predictive Calculation circuit 111 executes firmware instructions to predictively determine the potential for failure of multi-cell battery 186 based on either or both of the calculated impedance or rate of change of the calculated impedance. In some embodiments of the present invention, internal impedance calculation firmware 182 is executed by embedded processor 113 causing a measurement of the voltage or other determination of the voltage across an individual battery cell 131, or where battery cells are connected in series a measurement of the voltage or other determination of the voltage across two or more of battery cells 131 may occur followed by division by the number of battery cells 131 to achieve an average battery cell voltage. The relationship of the resulting measurements is utilized to calculate internal impedance for multi-cell battery 186 and/or for individual battery cells 131 within multi-cell battery 186. In turn, a number of impedance values are generated over time for multi-cell battery 186 and/or for individual battery cells 131 within multi-cell battery 186. These values are used by dR/dT firmware 183 to calculate the rate of change of internal impedance for multi-cell battery 186 and/or for individual battery cells 131 within multi-cell battery 186.

In particular embodiments of the present invention, execution of internal impedance calculation firmware 182 by embedded processor 113 results in measurement of the voltage of one or more of battery cells 131, along with measurement of current and temperature. Based on these measurements, internal impedance of multi-cell battery 186 and/or individual battery cells 131 is calculated and stored to non-volatile memory 115. Execution of dR/dT firmware 183 by embedded processor 113 causes retrieval of the various impedance results from non-volatile memory and calculation of a rate of change of impedance of multi-cell battery 186 and/or of individual battery cells 131.

In addition, state predictive firmware 184 is executed by embedded processor 113 to detect aberrant behavior of multi-cell battery 186 and/or one or more individual battery cells 131. In particular, execution of state predictive firmware 184 determines whether any change in the internal impedance of multi-cell battery 186 is evident based on the previously generated values of dR/dT and/or R. As a change in internal impedance may indicate a potential failure of multi-cell battery 186, the condition may be flagged and may be used to encourage replacement of battery system 100.

Figure 3:
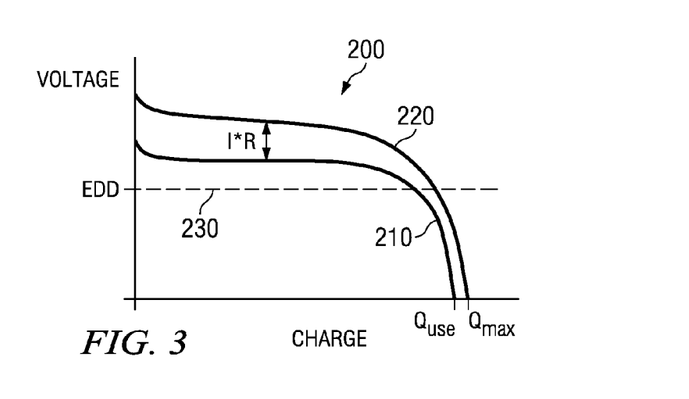
FIG. 3 is a graph showing a loaded voltage curve and an unloaded voltage curve as a function of charge.

Turning to FIG. 3, a graph 200 shows a comparison of the both loaded voltage 210 and unloaded voltage 220 (i.e., voltage in a no-current or very low current condition) over the course of battery discharge. As shown, unloaded voltage 220 is greater than loaded voltage by an amount corresponding to I*R, where I is the current supplied to a load by the battery and R is the internal battery impedance at a particular depth of discharge (DOD). The battery is discharged until the voltage extends below an end of discharge voltage (EOD) 230 indicated by a dashed line. The total charge available for discharge is $Q_{max}$, and the total usable charge is $Q_{use}$. $Q_{max}$ is defined as the amount of capacity (i.e., charge) required to pass through the battery to reduce the open circuit voltage OCV from the manufacturer's specified maximum voltage $V_{max}$ (e.g., 4.2 volts for a lithium-ion battery) to the manufacturer's specified minimum voltage $V_{min}$ (e.g., is 2.7 volts for a lithium-ion battery). By way of definition, the terms "unloaded" or "no-current" battery capacity mean that the current flow through the battery is so low as to be not appreciable in its effect on an OCV measurement, and that a sufficient amount of relaxation time has passed since the battery was last subjected to current that the open circuit voltage no longer noticeably changes with time. The unloaded capacity value $Q_{max}$ valid for a particular new battery can be stored in non-volatile memory 115 prior to operation of battery system 100, and updated using appropriate means during battery operation. A pre-calculated table of values of unloaded voltage 220 verses SOC or DOD is maintained in non-volatile memory 115. Thus, using the previously determined value of SOC or DOD, a corresponding expected value of unloaded voltage 220 can be retrieved from non-volatile memory 115. In addition, current (I) and loaded voltage 210 may be measured directly during operation of multi-cell battery 186. Using this information, the value of the internal impedance of multi-cell battery 186 may be calculated based on the following equation:

$$V_{loaded} = V_{unloaded} - IR, \text{ or}$$

$$R = (V_{unloaded} - V_{loaded})/I.$$

Monitoring changes in the internal impedance of multi-cell battery 186 allows for the collection of a historical view of an expected rate of change over the course of discharge. Calculating this rate of change may include, for example, performing a linear regression analysis on the values for the internal impedance over time. A substantial departure from the historic rate of change of internal impedance may indicate significant structural changes in multi-cell battery 186. For example, a substantial departure from the historic rate of change of internal impedance may indicate exfoliation of a large part of active material within one or more battery cells 131 of multi-cell battery 186. Alternatively, or in addition, a substantial departure from the historic rate of change of internal impedance may indicate a crack in a current collector or separator in one or more of battery cells 131 resulting in a progressive increase in impedance growth rate associated with multi-cell battery 186. Based on the disclosure provided herein, one of ordinary skill in the art will recognize other potential failure mechanisms that may be signaled by a departure from the historic rate of change of internal impedance.

As previously discussed, various embodiments of the present invention rely on calculating the internal impedance (R) of multi-cell battery 186. This may include calculation of the internal impedance for individual battery cells 131 of multi-cell battery 186. As one example, internal impedance may be calculated similar to that discussed in U.S. Pat. No. 6,832,171 entitled "Circuit and Method for Determining Battery Impedance Increase With Aging", and filed by Barsoukov et al. on May 2, 2003. The entirety of the aforementioned US Patent is incorporated herein by reference for all purposes.

Figure 4:
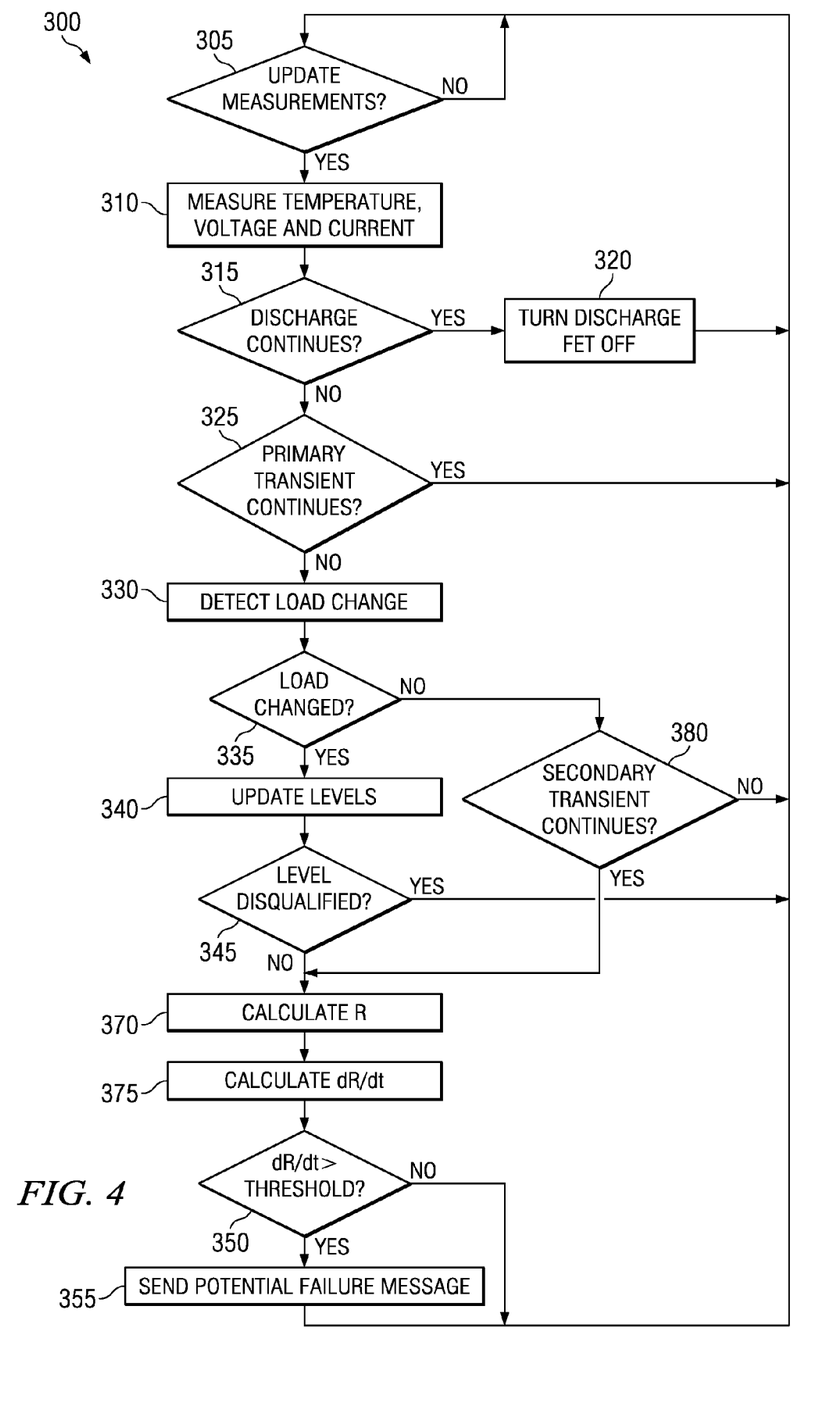
FIG. 4 is a flow diagram depicting a method in accordance with some embodiments of the present invention for detecting potential battery failures through comparison of the rate of change of internal resistance against an absolute threshold.

Turning to FIG. 4, a flow diagram 300 depicts a method in accordance with some embodiments of the present invention for detecting potential battery failures through comparison of the rate of change of internal impedance against an absolute threshold. Following flow diagram 300, it is determined whether a measurement period has been satisfied (block 305). This measurement period controls how often measurements of voltage, current and temperature are taken from multi-cell battery 186. Once the measurement period is satisfied (block 305), temperature, voltage and current of battery 186 are measured (block 310). Such measurement may be completed, for example, by reading values returned from temperature sensor circuit 114, and analog to digital converters 116, 117.

Next, it is determined whether the battery is currently in a discharge cycle (block 315). In some cases, this may be determined by determining whether the present voltage V exceeds the manufacturer's "terminal" voltage (i.e., minimum safe voltage) $V_{min}$. Where a discharge is not ongoing (block 315), control circuit 120 turns off power transistor 139 (block 320). Alternatively, where a discharge is ongoing (block 315), it is determined whether a primary transient of the battery voltage caused by turning off a utilization device powered by multi-cell battery 186 is continuing (block 325). This may be accomplished by determining if the present time t which began when the present discharge cycle of the battery began (i.e., when the utilization device was turned on or was operatively connected to multi-cell battery 186) exceeds a predetermined time t_prime. In an exemplary scenario, t_prime may be a one thousand second battery time constant.

Where the primary transient is continuing (block 325), the internal impedance of the battery is not updated. Rather, another measurement period is awaited (block 305), and upon completion the aforementioned processes are repeated (blocks 310-325). Alternatively, where the primary transient is not continuing (i.e., the primary transient is over) (block 325), a routine is performed to determine whether any substantial change in the load being driven by multi-cell battery 186 has occurred (block 330). Where a load change has occurred (block 335), levels are updated (block 340). This may include setting a time quantity (t_lev) equal to the time (t-t_last) at which the load changed, where t is the present time, t_last is the time when the load was most recently changed, and t_lev is the direction of change the previous load. In addition, t_last is set equal to the present time (t), so the new value of t_last is the beginning of the present load. It should be understood that there are two situations where the load can be considered to have changed, or diminished. One situation is that it is determined that the load level sufficiently diminished, and the time point when the load level sufficiently diminished is recorded. The other situation is that the load level did not change within a certain amount of time, in which case the present time is recorded.

Then, it is determined whether the previous load has been present long enough (i.e., is t_lev<programmable threshold) to allow the primary transient to adequately diminish (block 345). If the period is not sufficiently long (block 345), the obtained level is disqualified and the processes of blocks 305-345 are repeated without updating. Alternatively, where the period is long enough (block 345), the internal impedance is calculated using the measured results (block 370). Such impedance measurements may be accomplished using any impedance calculation approach known in the art. As one example, internal impedance may be calculated in accordance with the processes described in relation to FIGS. 3 and 4 of U.S. Pat. No. 6,832,171 that was previously incorporated herein by reference for all purposes.

Where it is determined that the load has not substantially changed (block 335), it is determined whether a second transient has settled (block 380). In particular, it is determined whether if t_min<t-t_last. Where this is the case, a secondary transient attributed to a load change is considered to have finished. Where the secondary transient has finished (block 380), the internal impedance is calculated using the measured results (block 370). Again, such impedance measurements may be accomplished using any impedance calculation approach known in the art. As one example, internal impedance may be calculated in accordance with the processes described in relation to FIGS. 3 and 4 of U.S. Pat. No. 6,832,171 that was previously incorporated herein by reference for all purposes. Otherwise, where the secondary transient has not yet completed (block 380), the internal impedance of the battery is not updated. Rather, another measurement period is awaited (block 305), and upon completion the aforementioned processes are repeated for the new measurements. The processes of the preceding blocks may be repeated a number of times to obtain different values for internal impedance.

Two or more values of R may be combined to compute a rate of change of internal impedance (dR/dT) for multi-cell battery 186 or for particular battery cells 131 of multi-cell battery 186 (block 375). In some particular cases, dR/dT is calculated using the following equation:

$$dR/dT = (R_{current} - R_{previous})/\text{Time},$$

where $R_{current}$ is the most recently calculated value of internal impedance, and $R_{previous}$ is a preceding value of internal impedance calculated during the same operational period, and time is the period between the two measurements. It should be noted that as used herein, the term "Time" (or dT) is used in its broadest sense to indicate a period. Such a period may be expressed as absolute time, or in terms of a number of events such as, for example, charge/discharge cycles. Thus, for example, dQ/dT may express a change in charge after four consecutive series of discharge and relaxation periods, or a change in charge available after a period of time. The aforementioned equation provides for a relatively immediate change in the value of internal impedance. As such an immediate value may be susceptible to noise, one or more embodiments of the present invention may use an average value of dR/dT that minimizes the effect of noise. As one example, an average value of dR/dT may be calculated using the following equation:

$$(dR/dT)_{average} = [(R_{current} - R_{previous})/\text{Time} + N*(dR/dT)_{previous}]/(N+1),$$

where N is the number of previous values of dR/dT used in the averaging function. Again, it should be noted that "Time" may be absolute time or some other indication of time such as, for example, a number of charge/recharge cycles of multi-cell battery 186 rather than absolute time.

The calculated value (either the immediate value or averaged value) of dR/dT (block 345) may then be compared against a programmable threshold value (block 350). Where dR/dT is greater than the threshold value (block 350), a potential battery failure message is generated and sent to a recipient device (see FIG. 6, element 520). Said another way, where the rate of change of internal impedance exceeds a threshold value, a potential battery failure may be indicated. Based on the received message, the recipient device may cause a message indicating a potential failure and encouraging removal and replacement of the battery. In some cases, the recipient device applies some level of filtering to the received messages to assure that a single message does not indicate a false positive indication of potential battery failure.

Where the recipient device decides that an error message rises to the level of seriousness that warrants intervention, the recipient device may disable multi-cell battery 186 by disconnecting it from any charging or discharging circuitry connected to multi-cell battery 186. A message may then be displayed to a user that encourages the user to remove multi-cell battery 186 and to safely discharge the battery.

It should be noted that other embodiments of the present invention may compare impedance values directly, rather than or in addition to comparison of rate of change of impedance. In particular some embodiments of the present invention may identify potential failure conditions by comparing a calculated value of impedance against a threshold window according to the following pseudo code:

```
If (R < threshold X && R > threshold Y)
{
        Indicate a Potential Failure Condition
}
Else
{
},
``` where threshold X<threshold Y. In some cases, the impedance value used in the aforementioned comparison is an average impedance value that eliminates some effects of noise on the impedance measurement process.

Figure 5:
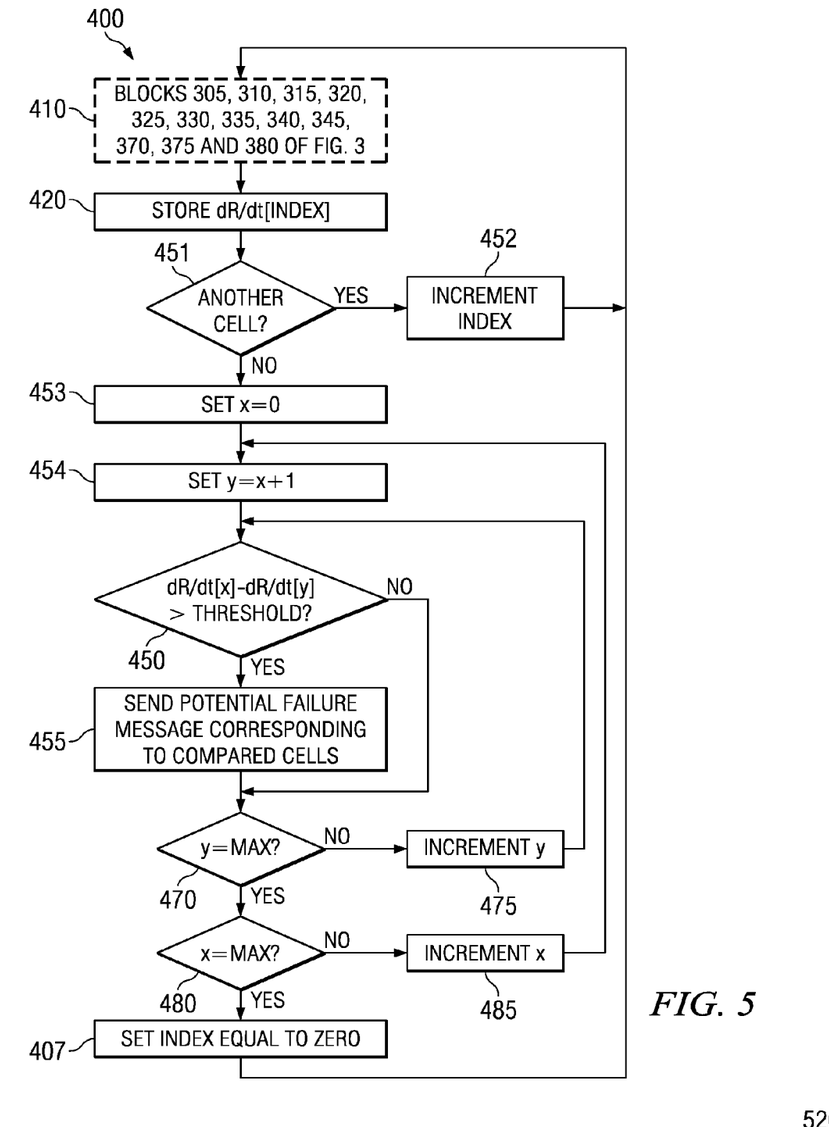
FIG. 5 is a flow diagram depicting a method in accordance with other embodiments of the present invention for detecting potential battery failure through comparison of the rate of change of internal resistance across individual battery cells of a battery.

Turning to FIG. 5, a flow diagram 400 depicts a method in accordance with other embodiments of the present invention for detecting potential battery failure through comparison of the rate of change of internal impedance across individual battery cells of a battery. Following flow diagram 400, initially an Index value is set equal to zero (block 407). This Index value represents a particular one of battery cells 131 within multi-cell battery 186. Thus, where multi-cell battery 186 includes four battery cells 131, Index would go between zero and three. With Index equal to zero, measurements of battery cell zero are taken and the processes for calculating internal impedance discussed above in relation to blocks 305, 310, 315, 320, 325, 330, 335, 340, 345, 370, 375 and 380 of FIG. 4 are performed to calculate the internal impedance of battery cell zero and dR/dT associated with battery cell zero (block 410). The calculated value (either the immediate value or averaged value) of dR/dT is stored in a memory array at the zero position of dR/dT[Index] (block 420).

It is then determined whether the Index is equal to the total number of battery cells 131 within multi-cell battery 186 (block 451). Where it is not equal (block 451), Index is incremented (block 452) and the processes of block 410 are repeated for the next battery cell 131 within multi-cell battery 186.

Alternatively, Once Index is equal to the maximum number of battery cells 131 (block 451), a dR/dT value will have been created for each of battery cells 131. These values of dR/dT may then be compared with each other to determine if the rate of change of internal impedance for one of battery cells 131 is significantly different than for that of other battery cells. A substantial difference in the rate of change of internal impedance between battery cells may indicate a potential failure ongoing in one of the compared cells.

Following flow diagram 400, two comparison counters are used, x and y, and each are initialized with x equal to zero and y equal to x+1 (blocks 453, 454). With this done, the difference between dR/dT[x] and dR/dT[y] is compared against a programmable threshold value (block 450). Where the difference exceeds the threshold (block 450), a potential failure message is sent (block 455). It is then determined whether the counter value y equals the total number of battery cells 131 within multi-cell battery 186 less one (block 470). Where y does not equal the maximum (block 470), y is incremented (block 475) and the process of comparing the difference between dR/dT[x] and dR/dT[y] against the programmable threshold value and error reporting is repeated for the new value of y (blocks 450-470).

Alternatively, where the value of y is equal to the maximum (block 470), it is determined whether x equals the total number of battery cells 131 within multi-cell battery 186 less two (block 480). Where x does not equal the maximum (block 480), x is incremented (block 485), y is set to x+1 (block 454), and the process of comparing the difference between dR/dT[x] and dR/dT[y] against the programmable threshold value and error reporting is repeated for the new value of y (blocks 450-470). This process continues until both x and y equal their respective maximums. At this point, all of the possible combinations of dR/dT have been compared and the process of flow diagram is restarted by setting Index to zero (block 407) and repeating the process of determining a rate of change of internal impedance for each of battery cells 131, and comparing those results to determine whether there is some indication of a potential error in multi-cell battery 186. It should be noted that the approach set forth in blocks 453 through blocks 485 is exemplary of various processes for comparing the rate of impedance change across battery cells, and that based on the disclosure provided herein, one of ordinary skill in the art will recognize a variety of different approaches that may be utilized to perform the various comparisons in accordance with different embodiments of the present invention.

It should be noted that a comparison of internal impedance may be performed across multiple battery cells 131 of multi-cell battery 186. Thus, rather than a comparison of the difference between dR/dT[x] and dR/dT[y] against a programmable threshold as was done in block 450, block 450 may be replaced with a comparison of the difference between R[x] and R[y] derived at the same time period. Such a comparison may be used in place of the comparison of the difference between dR/dT[x] and dR/dT[y] or in addition thereto.

A recipient device (see FIG. 6) may receive one or more messages indicating differences between battery cells 131. In some cases, where multiple messages would be sent, they are reduced to a single message provided to the recipient device. In various cases, the recipient device applies some level of filtering to the received messages to assure that a single message does not indicate a false positive indication of potential battery failure.

Where the recipient device decides that an error message rises to the level of seriousness that warrants intervention, the recipient device may disable multi-cell battery 186 by disconnecting it from any charging or discharging circuitry connected to multi-cell battery 186. A message may then be displayed to a user that encourages the user to remove multi-cell battery 186 and to safely discharge the battery.

It should be noted that SOC may affect the accuracy of any calculated impedance value. Hence, some embodiments of the present invention may compare impedance values derived for different battery cells 131 that are correlated to the SOC of the particular battery cell 131. Thus, for example, where multi-cell battery 186 includes two battery cells 131, and one of the battery cells 131 operates substantially different from the other, the difference between the cells may be compensated by comparing an impedance for one of the battery cells calculated at a particular SOC against an impedance for the other battery cell calculated at the same SOC. Thus, the immediate value of impedance or rate of change of impedance may not necessarily be used in any comparison.

As an example, assume that impedance is periodically calculated for two different battery cells each X seconds. In this case, the SOC of each of the battery cells may also be calculated at each X second period, and the calculated impedance may be correlated to the calculated SOC. As one particular example, SOC may be calculated similar to that discussed in U.S. Pat. No. 6,789,026 entitled "Circuit and Method for Monitoring Battery State of Charge", and filed by Barsoukov et al. on May 2, 2003. The entirety of the aforementioned US Patent is incorporated herein by reference for all purposes. The aforementioned correlation of impedance values to SOC results in a group of impedance values for the first cell correlated to SOC of the first cell, and another group of impedance values for the second cell correlated to SOC of the second cell. Any comparison between the impedance values of the first cell and the second cell may use respective impedance values that are correlated to the same SOC (e.g., an impedance value corresponding to the 50% state of charge of the first cell, and an impedance value corresponding to the 50% state of charge of the second cell).

Figure 6:
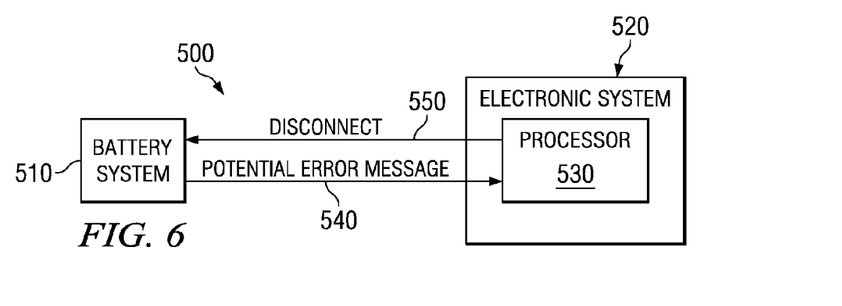
FIG. 6 shows a battery powered electronic system in accordance with different embodiments of the present invention.

Turning to FIG. 6, a battery powered electronic system 500 is depicted in accordance with different embodiments of the present invention. As shown, battery powered electronic system 500 includes a battery system 510 and some operating electronic system 520 (i.e., a recipient system) including a processor 530. It should be noted that operating electronic system 520 may be any electronic system including, but not limited to, a cellular telephone, a laptop computer, a game device, an audio player, or a video player. Based on the disclosure provided herein, one of ordinary skill in the art will recognize a variety of electronic systems that may be used in relation to different embodiments of the present invention. Battery system 510 may be any battery capable of providing a potential error message 540, and for receiving and acting on a request to disconnect 550. Thus, battery system 100 may be used in place of battery system 510. In operation, when a potential error message 540 is received by processor 530, processor 530 may make one or more analysis to determine whether the message is a false positive. Where the error is not a false positive, processor 530 may send a disconnect signal 550 causing battery system 510 to be disconnected from any charging circuit and from electronic system 520. Further battery system 510 may be subjected to any process deemed helpful to rendering battery 510 safe.

In conclusion, the present invention provides novel systems, devices, methods for detecting potential battery failure. While detailed descriptions of one or more embodiments of the invention have been given above, various alternatives, modifications, and equivalents will be apparent to those skilled in the art without varying from the spirit of the invention. For example, various embodiments of the present invention are described in relation to a multi-cell battery, but it should be noted that various of the approaches discussed herein may be readily applied to a single cell battery. Further, one or more structural aspects of the battery may be analyzed in addition to the impedance measurements discussed herein including, for example, a change in full chemical capacity, useable capacity or the like. As another example, calculation of impedance may be more accurate for different values of SOC. Thus, some embodiments of the present invention may be limited to utilizing impedance calculations that are done within a limited range of SOC or DOD. Therefore, the above description should not be taken as limiting the scope of the invention, which is defined by the appended claims.

What is claimed is:

1. A battery system including predictive failure determination based on the time rate of change of internal impedance, wherein the battery system comprises:
   a battery;
   an embedded processor; and
   a computer readable medium, wherein the computer readable medium includes instructions executable by the embedded processor to:
      measure at least one characteristic of the battery,
      calculate a time rate of change of internal impedance of the battery based at least in part on the at least one characteristic of the battery; and
      determine a potential failure condition based on the time rate of change of internal impedance of the battery.

2. The battery system of claim 1, wherein the at least one characteristic of the battery is selected from a group consisting of: voltage, current and temperature.

3. The battery system of claim 1, wherein determining the potential failure condition based on the time rate of change of internal impedance of the battery includes:
   comparing the time rate of change of internal impedance of the battery against a threshold value; and
   indicating a potential failure of the battery whenever the time rate of change of internal impedance of the battery exceeds the threshold.

4. The battery system of claim 3, wherein the threshold is programmable.

5. The battery system of claim 3, wherein the time rate of change of internal impedance of the battery is selected from a group consisting of: an immediate time rate of change and an average time rate of change.

6. The battery system of claim 1, wherein the battery includes a first battery cell and a second battery cell, wherein measuring the at least one characteristic of the battery includes measuring at least one characteristic of the first battery cell and measuring at least the same characteristic of the second battery cell, and wherein calculating the time rate of change of internal impedance of the battery includes calculating a first time rate of change of internal impedance of the first battery cell based on the measured characteristic of the first battery cell and calculating a second time rate of change of internal impedance of the second battery cell based on the measured characteristic of the first battery cell.

7. The battery system of claim 6, wherein determining the potential failure condition based on the time rate of change of internal impedance of the battery includes:
   comparing the difference between the first time rate of change of internal impedance and the second time rate of change of internal impedance against a threshold value; and
   indicating a potential failure of the battery whenever an absolute value of the difference between the first time rate of change of internal impedance and the second time rate of change of internal impedance exceeds the threshold.

8. The battery system of claim 7, wherein the threshold is programmable.

9. The battery system of claim 7, wherein both the first time rate of change of internal impedance and the second time rate of change of internal impedance are selected from a group consisting of: an immediate time rate of change and an average time rate of change.

10. A method for predicting battery failure, the method comprising:
    providing a battery;
    measuring at least one characteristic of the battery;

calculating an internal impedance of the battery based at least in part on the at least one characteristic of the battery;

calculating a time rate of change of internal impedance of the battery based at least in part on the calculated internal impedance; and determining a potential failure condition based on the time rate of change of the internal impedance of the battery.

11. The method of claim 10, wherein determining the potential failure condition based on the time rate of change of internal impedance of the battery includes:

comparing the time rate of change of internal impedance of the battery against a threshold value; and indicating a potential failure of the battery whenever the time rate of change of internal impedance of the battery exceeds the threshold.

12. The method of claim 11, wherein the time rate of change of internal impedance of the battery is selected from a group consisting of: an immediate time rate of change and an average time rate of change.

13. The method of claim 10, wherein the battery includes a first battery cell and a second battery cell, wherein measuring the at least one characteristic of the battery includes measuring at least one characteristic of the first battery cell and measuring at least the same characteristic of the second battery cell, and wherein calculating the time rate of change of internal impedance of the battery includes calculating a first time rate of change of internal impedance of the first battery cell based on the measured characteristic of the first battery cell and calculating a second time rate of change of internal impedance of the second battery cell based on the measured characteristic of the first battery cell.

14. The method of claim 13, wherein determining the potential failure condition based on the time rate of change of internal impedance of the battery includes:

comparing the difference between the first time rate of change of internal impedance and the second time rate of change of internal impedance against a threshold value; and indicating a potential failure of the battery whenever an absolute value of the difference between the first time rate of change of internal impedance and the second time rate of change of internal impedance exceeds the threshold.

15. The method of claim 10, wherein determining a potential failure condition based on internal impedance of the battery includes: comparing the time rate of change of the internal impedance against a threshold window, wherein the time rate of change of the internal impedance being outside of the threshold window indicates a potential error condition.

16. The method of claim 10, wherein the method further comprises:

averaging a number of impedance values over time, and wherein determining a potential failure condition based on internal impedance of the battery includes:

comparing the time rate of change of the averaged internal impedance against a threshold window, wherein an averaged time rate of change of the internal impedance outside of the threshold window indicates a potential error condition.

17. An electronic system, wherein the electronic system comprises:

a battery powered electronic circuit, wherein the battery powered electronic circuit includes a device processor; and a battery system, wherein the battery system powers the electronic circuitry, and wherein the battery system includes:

a battery;

an embedded processor; and a computer readable medium, wherein the computer readable medium includes instructions executable by the embedded processor to: measure at least one characteristic of the battery, calculate a time rate of change of internal impedance of the battery based at least in part on the at least one characteristic of the battery, and determine a potential failure condition based on the time rate of change of internal impedance of the battery.

18. The electronic system of claim 17, wherein the battery powered electronic circuit forms at least part of a device selected from a group consisting of: a cellular telephone, a laptop computer, a game device, an audio player, and a video player.

19. The electronic system of claim 18, wherein the battery includes a first battery cell and a second battery cell; wherein measuring the at least one characteristic of the battery includes measuring at least one characteristic of the first battery cell and measuring at least the same characteristic of the second battery cell; wherein calculating the time rate of change of internal impedance of the battery includes calculating a first time rate of change of internal impedance of the first battery cell based on the measured characteristic of the first battery cell and calculating a second time rate of change of internal impedance of the second battery cell based on the measured characteristic of the first battery cell; and wherein determining the potential failure condition based on the time rate of change of internal impedance of the battery includes:

comparing the difference between the first time rate of change of internal impedance and the second time rate of change of internal impedance against a threshold value; and indicating a potential failure of the battery whenever an absolute value of the difference between the first time rate of change of internal impedance and the second time rate of change of internal impedance exceeds the threshold.

20. The electronic system of claim 19, wherein the computer readable medium includes instructions executable by the embedded processor to:

send the potential failure indication to the device processor.

21. The electronic system of claim 20, wherein the device processor is operable to:

disconnect the battery from the battery powered electronic circuit; and provide a user message indicating the potential failure indication.

* * * * *